(12) United States Patent
Steber et al.

(10) Patent No.: US 6,904,273 B2
(45) Date of Patent: Jun. 7, 2005

(54) METHOD AND SYSTEM FOR AUTOMATIC GAIN CONTROL IN A SATELLITE COMMUNICATIONS SYSTEM

(75) Inventors: J. Mark Steber, Frederick, MD (US); Richard Clewer, Ijamsville, MD (US); Kumud Patel, Germantown, MD (US); Bala Subramaniam, Potomac, MD (US)

(73) Assignee: Hughes Electronics Corporation, El Segundo, CA (US)

( * ) Notice: Subject to any disclaimer, the term of this patent is extended or adjusted under 35 U.S.C. 154(b) by 501 days.

(21) Appl. No.: 10/043,668

(22) Filed: Jan. 10, 2002

(65) Prior Publication Data

US 2002/0098814 A1 Jul. 25, 2002

Related U.S. Application Data

(60) Provisional application No. 60/260,840, filed on Jan. 10, 2001.

(51) Int. Cl.[7] ................................................ H04B 1/06
(52) U.S. Cl. .............................. 455/234.1; 455/247.1; 455/241.1; 375/345
(58) Field of Search ..................... 455/127.4, 232.1, 455/241.1, 245.2, 246.1, 247.1, 249.1, 234.1; 375/344, 345

(56) References Cited

U.S. PATENT DOCUMENTS

| 5,513,387 | A | * | 4/1996 | Saito et al. ............... 455/243.1 |
|---|---|---|---|---|
| 5,551,072 | A | * | 8/1996 | Watanabe ................. 455/226.2 |
| 5,862,465 | A | * | 1/1999 | Ou ............................ 455/234.1 |
| 5,974,095 | A | * | 10/1999 | Kitaura et al. .............. 375/340 |
| 6,038,435 | A | * | 3/2000 | Zhang ...................... 455/234.1 |
| 6,167,244 | A | * | 12/2000 | Tomoe ..................... 455/234.1 |
| 6,445,732 | B1 | * | 9/2002 | Beamish et al. ............ 375/224 |
| 6,563,891 | B1 | * | 5/2003 | Eriksson et al. ............ 375/345 |
| 6,728,524 | B2 | * | 4/2004 | Yamanaka et al. ....... 455/232.1 |
| 2002/0025792 | A1 | * | 2/2002 | Isoda ....................... 455/234.1 |

* cited by examiner

*Primary Examiner*—Edward R. Urban
*Assistant Examiner*—Blane J. Jackson
(74) *Attorney, Agent, or Firm*—Craig Plastrik

(57) ABSTRACT

An apparatus for providing automatic gain control for use in a satellite terminal of a satellite communication system capable of transmitting a plurality of different modes of data. The apparatus includes a demodulator circuit having an analog to digital converter; a first variable attenuator having an attenuation value set on the basis of a measured power level of a predetermined data signal; and a second variable attenuator having an attenuation value set on the basis of the mode of data being received by the satellite terminal, where each of the data modes have a corresponding predetermined attenuation value associated therewith which is utilized as the attenuation value of the second variable attenuator when the satellite terminal receives the data mode.

16 Claims, 4 Drawing Sheets

METHOD AND SYSTEM FOR AUTOMATIC GAIN CONTROL IN A SATELLITE COMMUNICATIONS SYSTEM

RELATED APPLICATIONS

This application claims priority under 35 U.S.C. §119(e) to provisional application Ser. No. 60/260,840 filed Jan. 10, 2001.

FIELD OF THE INVENTION

The present invention relates to a method and system for implementing an automatic gain control (AGC) technique for use in satellite communication systems and more particularly, to a cost effective AGC technique capable of compensating for wide variations in the input signal power level.

BACKGROUND OF THE INVENTION

The use and need for AGC techniques in receivers utilized in satellite communication systems in order to compensate for variations in the power level of the received signal is well known in the art. Generally speaking, the AGC portion of the receiver functions to maintain the power level of the received/incoming signal within some predetermined range.

Typically, satellite receivers utilizing current technology employ digital demodulators which function to downconvert and demodulate the incoming data signal, and which utilize A/D converters to convert the incoming analog data into a digital format. In operation, such A/D converters included in the demodulator require a fixed number of bits so as to provide the necessary resolution so as to allow the carrier recovery loops contained in the demodulator to function properly (e.g., minimize signal quantization errors). The number of bits the A/D requires to provide the necessary resolution can be readily determined based on system requirements. The remaining bits of the A/D converter are utilized to compensate for variations in the power level of the incoming data signal (i.e., the dynamic range of the input data signal). Accordingly, if the input signal is expected to have a large dynamic range, then additional bits of the A/D must be dedicated to handling the variations in the dynamic range.

In prior art systems, when additional bits were necessary to compensate for an increase in the dynamic range of the input signal, the solution was simply to increase the number of bits of the A/D converter. As such, the A/D converter would have the requisite bits necessary to provide the desired resolution, as well as the requisite bits necessary to handle the dynamic range requirements.

However, as the data rates utilized by today's communication systems continue to increase, especially so with satellite communication systems, adding additional bits to the A/D converter to handle an increase in dynamic range is no longer a feasible solution. For example, in a system allocating 5 bits of the A/D converter for signal quantization resolution, and which requires the ability to compensate for a 30 db dynamic range variation with respect to the input signal, an additional 5 bits are necessary. Thus, a 10 bit A/D converter would be required. However, such high resolution A/D converters operating at high data rates (e.g., 800 MHz) would be exceedingly expensive, and clearly could not be utilized in any commercially viable product/system.

Accordingly, there exists a need for an AGC technique and implementation that allows for the compensation of a large dynamic range with respect to the input signal without requiring an increase in the resolution capabilities of the A/D converter contained in the demodulator of the communication system.

SUMMARY OF THE INVENTION

The present invention relates to a method and system for implementing automatic gain control in a communication system that allows for the compensation of a large dynamic range regarding the input signal without requiring an increase in the resolution capabilities of the A/D converter contained in the demodulator of the communication system.

More specifically, the present invention relates to an apparatus for providing automatic gain control for use in a satellite terminal of a satellite communication system capable of transmitting a plurality of different modes of data. The apparatus includes a demodulator circuit having an analog to digital converter; a first variable attenuator having an attenuation value set on the basis of a measured power level of a predetermined data signal; and a second variable attenuator having an attenuation value set on the basis of the mode of data being received by the satellite terminal, where each of the data modes has a corresponding predetermined attenuation value associated therewith which is utilized as the attenuation value of the second variable attenuator when the satellite terminal receives the data mode.

In addition, the present invention relates to a method for providing automatic gain control for use in a satellite terminal of a satellite communication system capable of transmitting a plurality of different modes of data. The method comprises the steps of: (1) measuring a power level of a predetermined data signal received by the satellite terminal, (2) adjusting an attenuation value of a first variable attenuator on the basis of the measured power level of the predetermined data signal, (3) adjusting an attenuation value of a second variable attenuator on the basis of the mode of data being received by the satellite terminal, where each of the data modes has a corresponding predetermined attenuation value associated therewith which is utilized as the attenuation value of the second variable attenuator when the satellite terminal receives the data mode. As a result of the foregoing method, the first variable attenuator and the second variable attenuator are operative for maintaining the input power level to an analog to digital converter contained in a demodulator of the satellite terminal within a predetermined range.

As described below, the system and method of providing automatic gain control in accordance with the present invention provides important advantages over prior art devices. Most importantly, the AGC system and method of the present invention allows for the compensation/processing of a wide dynamic range regarding the input signal without requiring the use of a fast, high-order bit A/D converter in the demodulator. As noted, the use of such an A/D converter (assuming it is available) would render the overall system prohibitively expensive due to the cost of such an A/D converter. In contrast, as the present invention allows for the compensation of a large dynamic range utilizing a low-cost, readily available A/D converter, the present invention results in a commercially viable system.

Additional advantages of the present invention will become apparent to those skilled in the art from the following detailed description of exemplary embodiments of the present invention.

The invention itself, together with further objects and attendant advantages, will best be understood by reference to the following detailed description, taken in conjunction with the accompanying drawings.

DETAILED DESCRIPTION OF THE DRAWINGS

The following detailed description of the novel AGC technique utilized in a satellite communication system sets forth exemplary embodiments of the present invention. It is noted, however, that the present invention as claimed herein is not intended to be limited to the specific embodiments disclosed in the following discussion. Clearly other implementations of the novel AGC technique for use with satellite communication systems, as well as other communication systems, are possible.

Figure 1:
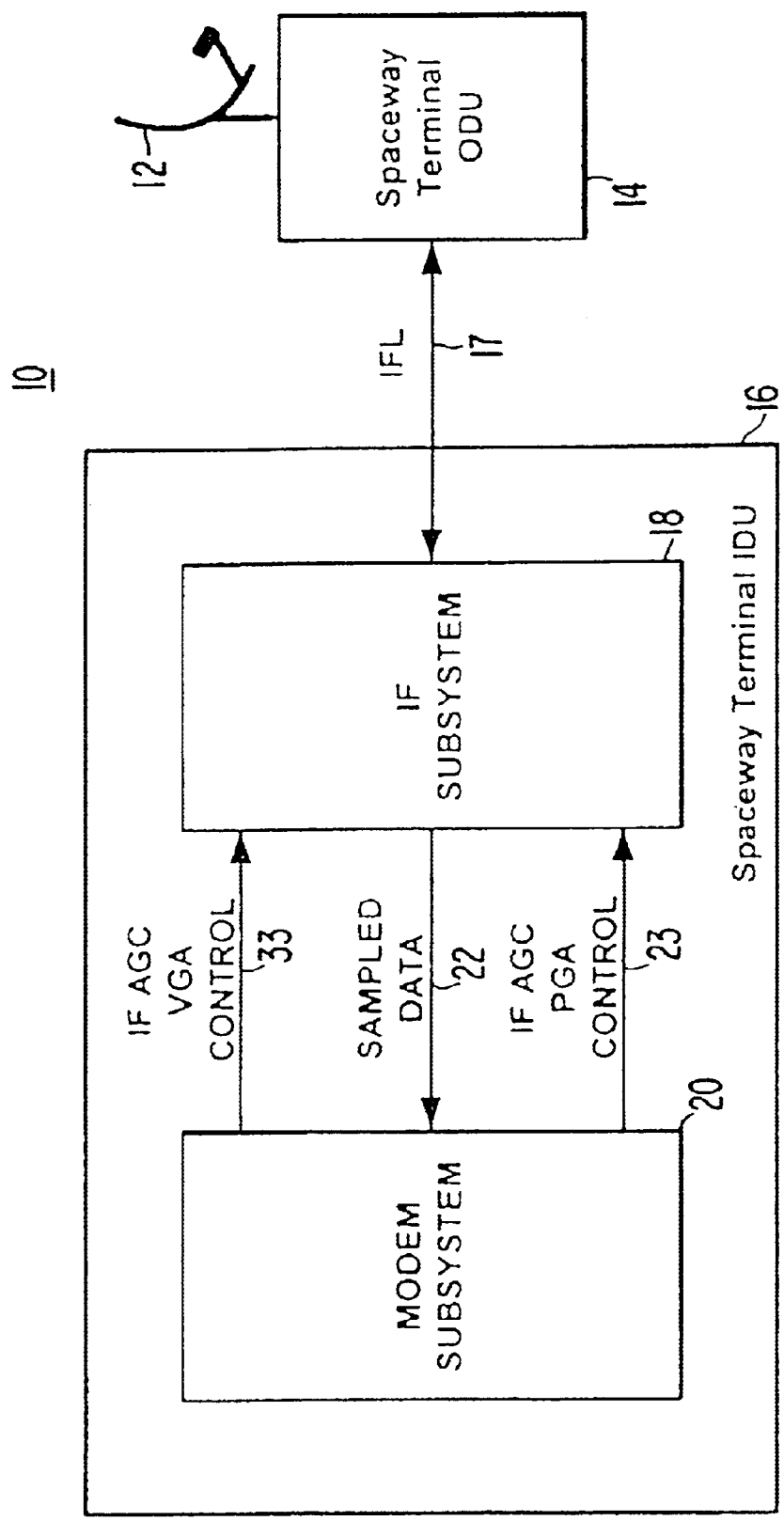
FIG. 1 is a block diagram of an exemplary satellite terminal 10 utilized in a satellite communication system.

FIG. 1 is a block diagram of an exemplary satellite terminal 10 utilized in a satellite communication system. As explained in detail below, the AGC technique of the present invention is implemented in the satellite terminal 10. Referring to FIG. 1, the satellite terminal comprises an antenna 12, an outdoor unit (ODU) 14 and an indoor unit (IDU) 16. In operation, the incoming data signal is coupled to the ODU 14 via the antenna 12. The ODU 14 functions to perform preliminary downconversion of the incoming signal, and then couples the signal to the IDU 16 via an interfacility link 17. The IDU comprises an IF subsystem 18 and a modem subsystem 20.

As explained in detail below, the IF subsystem 18 and the modem subsystem 20 operate to implement the AGC technique of the present invention. Generally speaking, the IF subsystem 18 performs AGC, downconverts and digitizes the signal received from the ODU, so as to generate a stream of data samples 22. The data samples output by the IF subsystem 18 are coupled to the modem subsystem 20, which functions to demodulate the sampled data 22 and to generate AGC control signals (i.e., a VGA control signal 33 and a PGA control signal 23) which are coupled to the IF subsystem 18.

The operation of the AGC technique of the present invention is now described. As stated above, one objective of the present invention is to allow for the use of the low cost A/D converter while simultaneously allowing for a wide dynamic range variation on the input signal. This is accomplished by the present invention by utilizing a priori knowledge regarding the power level of the incoming signals (based on the type/mode of signal) to continually adjust attenuators so as to maintain the power level range of the signal being fed to the A/D converter of the demodulator within a predetermined range. By dynamically changing the attenuation levels in the foregoing manner, it is possible to accommodate/process input signals having significantly large dynamic range variations utilizing a low cost A/D converter.

It is noted that the operation of the present invention is described in conjunction with the operation of a satellite communication system. However, it is possible to utilize the novel AGC control technique with any s system having a priori knowledge of the power level range of the incoming data signals.

Prior to a detailed discussion of the invention, a brief overview of the data signals generated by the satellite communications system is helpful. The system employs essentially four distinct signaling modes, which are: (1) Beacon mode (BCN); (2) CONUS4 (C4) mode; CONUS3 (C3) mode and point-to-point (PTP) mode, and transmits these data signals to the satellite terminal utilizing a Ka-band downlink (e.g., 19.9–20.2 GHz). The data signals are transmitted to the satellite terminals in a TDMA frame format, in which the data signals are transmitted at defined times with the frame. However, each satellite terminal in the system knows the signaling mode composition of a given frame at least one frame in advance of the receipt of the given frame. In other words, the satellite terminal knows which signal modes are to be included in a given frame prior to the actual transmission of the frame of data.

It is further noted that the power levels associated with the four signaling modes of the system are different. Specifically, the beacon signal is not power controlled by the system. As such, the beacon signal received at the satellite terminal is subject to power level variations. The C3, C4 and the PTP signals are power controlled, and are transmitted having different power levels than the beacon signal. For example, the C3 and C4 signals may be transmitted at signal levels 6 db higher than the beacon signal, while the PTP signal may be transmitted at a level 12 db over the CONUS signals. It is this variation in the input signal levels that the AGC technique of the present invention accounts for without requiring the use of prohibitively expensive A/D converters.

Figure 2:
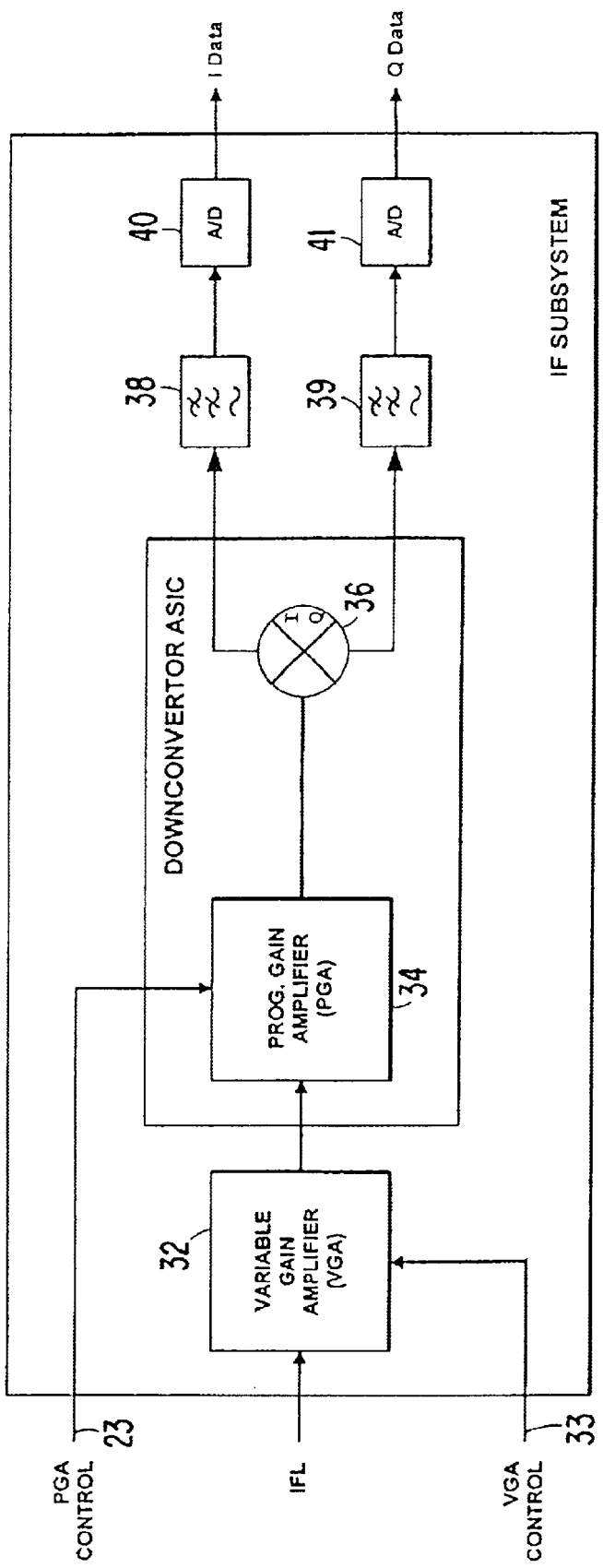
FIG. 2 is an exemplary block diagram of the IF subsystem module illustrated in FIG. 1.

FIG. 2 is an exemplary block diagram of the IF subsystem 18 module illustrated in FIG. 1. As shown in FIG. 2, the IF subsystem includes a variable gain amplifier (VGA) 32, a programmable gain amplifier (PGA) 34, a quadrature downconversion circuit 36, filters 38, 39 and AID converters 40, 41. The incoming data signal is first coupled to the to the variable gain amplifier 32 from the ODU via the IFL. As explained in more detail below, the variable gain amplifier 32 functions to compensate for long term power level variations in the received signal. In accordance with the present embodiment, the VGA 32 is initially adjusted based on the power level of the received Beacon signal such that the power level at the input of the A/D converters 40, 41 is at the desired value. As noted above, and explained below, the control signal for controlling the VGA 32 is generated by the modem subsystem 20. The output of the VGA 32 is coupled to the input of the PGA 34. As explained below, in the current embodiment, the PGA 34 is controlled in order to compensate for the dynamic burst-to-burst changes which result from receipt of CONUS and PTP signals. In other words, when it is known that a PTP signal (or CONUS signal) is being received by the satellite terminal 10, the PGA 34 is adjusted so as to negate the additional signal power contained in the PTP signal relative to the desired signal level, which is based on the beacon power level. The output of PGA 34 is coupled to the quadrature downconversion circuit 36, which functions to downconvert the IF signal into baseband I and Q data channels. Both the I and Q data channels are coupled to a respective filter 38, 39 and A/D converter 40, 41.

Accordingly, by utilizing the IF subsystem 18 illustrated in FIG. 2, it is possible to maintain the power level input into the AID converters 40, 41 within a predefined range, and more importantly, allow for the processing of input signals having a wide dynamic range without having to utilize expensive, high performance A/D converters. To summarize, the VGA 32 is utilized to compensate for long term power level variations (e.g., system performance variations), while the PGA 34 is utilized to dynamically compensate for changes in input power levels on a burst-to-burst basis.

Figure 3:
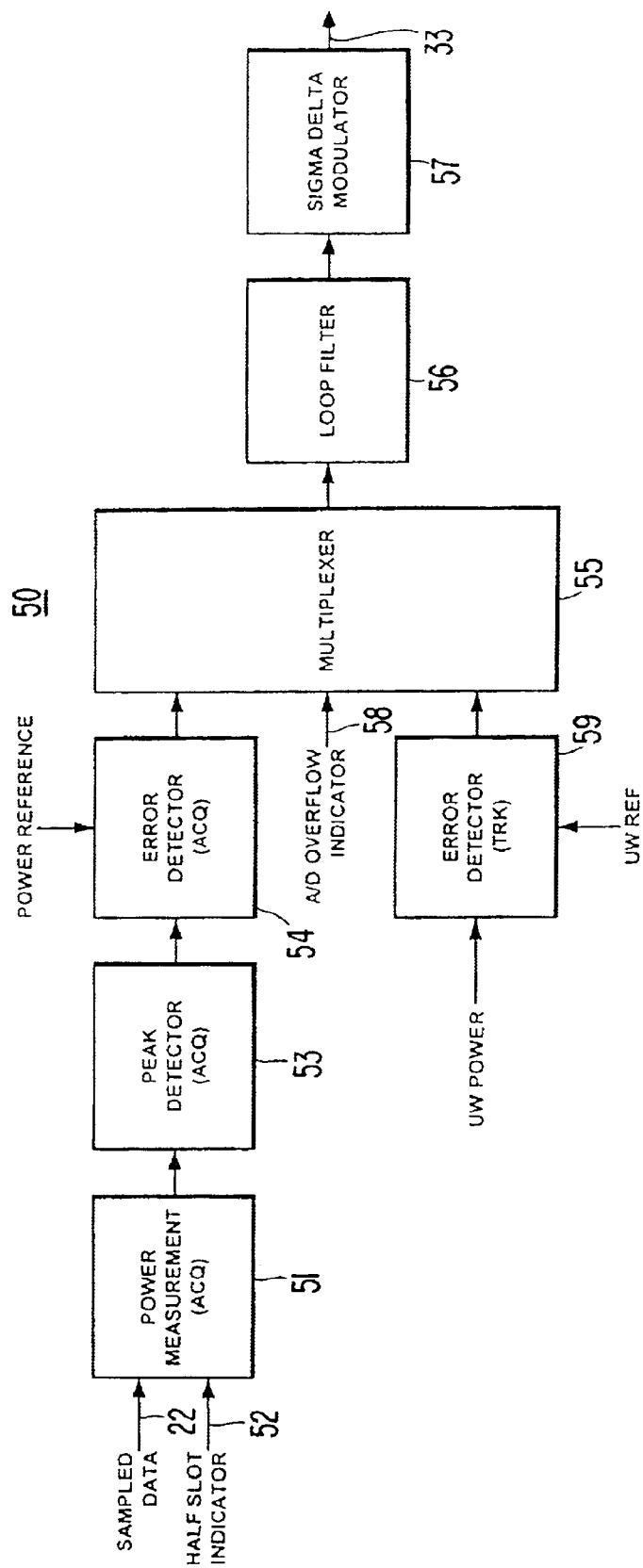
FIG. 3 is an exemplary block diagram of the VGA controller contained in the modem subsystem, which is utilized to generate the VGA control signal depicted in FIG. 2.

FIG. 3 is an exemplary block diagram of the VGA controller 50 contained in the modem subsystem 20, which is utilized to generate the VGA control signal 33 depicted in FIG. 2. It is noted that in the current embodiment, the VGA control signal 33 is generated on a continuous basis so as to allow the VGA 32 to adjust for variations in the power level of the beacon signal. The VGA controller 50 has two modes of operation, namely, an acquisition mode and a tracking mode.

In the acquisition mode (i.e., when the satellite terminal is first attempting to receive incoming data signals), the gain of the VGA 32 is initially set to its maximum value, and the gain of the PGA 34 is set to a predetermined nominal value, which is expected to allow receipt of the beacon signal. Once the VGA 32 and PGA 34 are initialized, sampled data from the IF subsystem 18 is coupled to a power measurement circuit 51, which functions to measure power for a given frame and to integrate the received power for each half-slot for the given frame. The power measurement circuit 51 also receives a half-slot indicator signal 52 as an input signal. The output of the power measurement circuit 51 is coupled to a peak detector circuit 53, which functions to store the peak power level output by the power measurement circuit 51. The output of the peak detector circuit 53 serves as a first input to an error detector 54. The second input to the error detector 54 is a predetermined power reference signal corresponding to the expected/desired power level. The predetermined power level can be based on, for example, the nominal beacon signal value. The error detector 54 functions to generate an error signal representing the difference between the peak power level of the incoming signal and the power reference signal. The error signal output by the error detector 54 is then coupled to a loop-filter 56 via a multiplexer 55. The loop-filter 56, which in the current embodiment, is a standard first-order filter, functions to smooth frame-frame variations in the power measurements. The bandwidth of the loop filter 56 is preferably chosen so as to allow tracking of the maximum rate of change of the input signal level, while at the same time providing sufficient filtering so that the power level does not fluctuate too greatly on a frame-to-frame basis. The output of the loop filter 56 is then coupled to a modulator 57 (e.g., sigma-delta modulator), which functions to modulate a carrier signal with the error signal. The output of the modulator 57 functions as the VGA control signal 33 illustrated in FIG. 2.

It is noted that in the given embodiment, in the acquisition mode, the VGA controller 50 initially functions to determine the highest input power level and then sets the VGA 32 based on this power reading so that the incoming PTP signals (which have the highest power rating) do not overload the A/D converters 40, 41.

Once the initial acquisition has been completed, the VGA controller 50 enters a tracking mode of operation (and as explained below the PGA controller begins to dynamically control the PGA so as to adjust the amplification based on the data type contained in each frame). In the tracking mode, the operation of the VGA controller 50 is similar to the operation in the acquisition mode, with the distinction that in the tracking mode, the error signal fed to the loop-filter 56 is generated based on the difference (i.e., correlation) between a Beacon unique word power measurement and a unique word reference signal, which corresponds to the desired/expected value of the beacon signal. Thus, the error detector 59 comprises a UW correlator. External beacon correlation circuitry supplies the unique word "UW" power value to the error detector input 59. Once again, the object of the VGA controller 50 in the tracking mode is to adjust the VGA 32 gain so as to maintain the beacon UW power at a predetermined value, which in the given embodiment, is between −6 and −15 dBFS. It is noted that the use of unique word correlations to determine differences in power levels is well known in the art, and therefore not described in further detail herein. However, it is also noted that the power measurements performed by the present invention are in no way limited to unique word correlation processes. Any suitable means of measuring and comparing the power levels can be utilized.

It is noted that in the event that the A/D converter 40, 41 is overdriven, the output of the UW correlator may not reflect the true value of the beacon power. If the A/D overflow indicator 58 is active during the beacon UW time interval, a negative offset is added to the error detector output value to force the VGA 32 gain lower. The offset is cleared at the end of the given frame.

Figure 4:
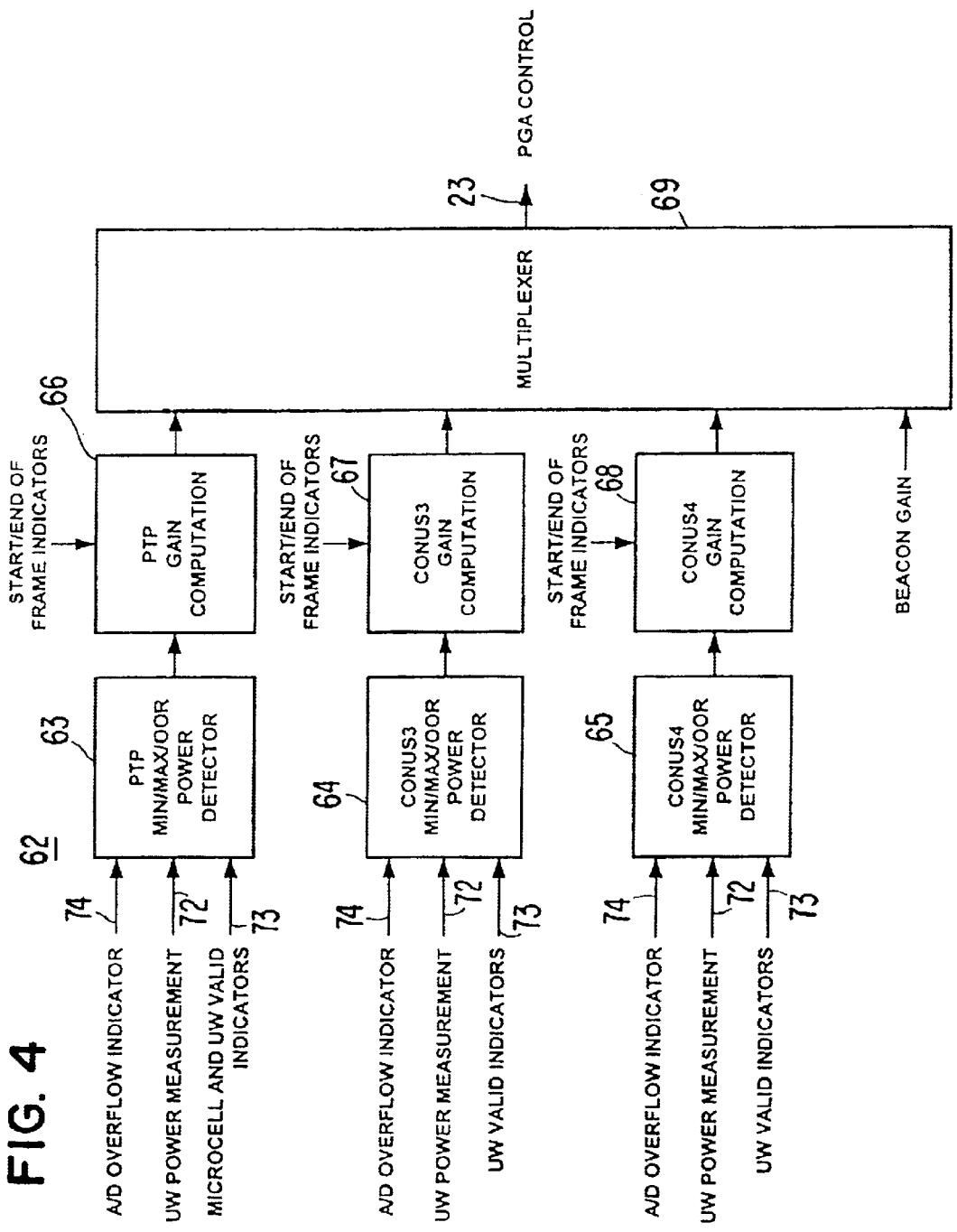
FIG. 4 is an exemplary block diagram of the PGA controller contained in the modem subsystem, which is utilized to generate the PGA control signal depicted in FIG. 2.

FIG. 4 is an exemplary block diagram of the PGA controller 62 contained in the modem subsystem 20, which is utilized to generate the PGA control signal 23 depicted in FIG. 2. As stated above, the PGA controller 62 functions to dynamically adjust the amplification of the PGA 34 in the IF subsystem 18 to compensate for changes in the signal levels associated with the C3, C4 and PTP signal modes relative to the beacon signal level.

Referring to FIG. 4, in the embodiment shown therein, the PGA controller 62 comprises a separate power detector 63, 64, and 65 for determining the power level of the incoming PTP, C3 and C4 data signals, respectively. Similar to the error detector 59 utilized in the AGC controller 50, the power detectors 63, 64 and 65 of the PGA controller 62 utilize UW correlation techniques to determine the power level of the respective incoming signal. The PGA controller 62 further includes gain computation circuits 66, 67, and 68 each of which, function to set the attenuation of the PGA 34 based on the type/mode of the received signal. As explained below, the gain computation circuits can also be utilized for adaptive adjustment of the amount of attenuation utilized so as to compensate for variations in the received signal levels due to, for example, rain fade, path loss, etc. The PGA controller 62 further comprises a multiplexer 69 which receives the outputs of the gain computation circuits and functions to select which of the outputs is coupled to the PGA 34. The multiplexer 69 further comprises an input for the beacon gain, which is utilized as a reference signal to set the PGA 34 when the other data modes are not being received by the satellite terminal 10.

In operation, the satellite terminal 10 knows a priori the signaling modes contained in a given incoming data frame. As such, prior to processing a given slot having a known signal mode, the PGA controller 62 functions to control the PGA to select the predetermined amount of attenuation associated with the given data mode. For example, assuming the slot contained a PTP signal, the PGA controller 62 would function to control the attenuation of the PGA 34 such that the power level of the PTP signal was reduced to substantially the desired nominal power level (which in the current embodiment is based on the nominal value of the beacon signal). In other words, upon receipt of a given data mode, the PGA 34 is controlled so as to have an attenuation value equal to the value the power level of the incoming signal is expected to be above the nominal value, thereby negating the increase in power level associated with the given data mode. As a result, the power level of the signal input into the A/D converters 40, 41 can be maintained at substantially the same level regardless of the type of received signal. It is noted that the required amount of attenuation necessary for a given type of signal can be stored in memory and recalled as necessary during operation. For example, the predetermined amount could simply be stored in the respective gain/attenuation circuit 66, 67 and 68 and output as the PGA control signal 23 as appropriate.

Returning to FIG. 4, as mentioned above, the embodiment of the PGA controller 62 illustrated in FIG. 4 also allows for the adaptive adjustment of the PGA attenuation values so as to compensate/adjust for variations in the power levels of the different signal modes (e.g., PTP, C3, C4) over time. The operator will be able to select between automatically adjusted values determined from the algorithm below, or the adaptation algorithm may be disabled and the attenuator will utilize software-programmable fixed values loaded into a register as described above.

One embodiment of an adaptive adjustment routine is as:

1. Nominal PGA gain values for BCN, C4, C3, and PTP bursts are determined by link budgets a priori, and are used as initial PGA controller values.
2. The UW power measurement is monitored for each type of burst, i.e., C4, C3, PTP, for which a valid UW detection occurs. Referring to FIG. 4, this step is accomplished by the respective power detectors 63, 64, and 65, each of which receive a UW power measurement and a microcell 72 (PTP only) and UW valid indicator signal 73 as input signals. As noted below, if the microcell (PTP only) and UW valid indicators do not confirm that the signal being processed was intended for the given satellite terminal, no adaptation or adjustment of the attenuation value occurs.
3. For each type of burst, if the UW power measurement is greater than the greatest UW power measured to that point for the given frame, the new maximum power measurement is stored in the appropriate maximum power register.
4. For each type of burst, if the UW power measurement is less than the smallest UW power measured to that point for the given frame, the new minimum power measurement is stored in the appropriate minimum power register.
5. For each type of burst, if the A/D out-of-range signal 74 becomes active during any burst in the frame, then the appropriate out-of-range indicator is set.
6. At the end of the frame, the maximum and minimum power values are compared to fixed predetermined limits, for each burst type (i.e., PTP, C3 and C4).
7. If the out-of-range indicator is set, the PGA gain value for that type of burst is adjusted downward by one step (2 dB) and stored in the appropriate register.
8. If the maximum power register value is greater than the maximum power threshold, the PGA gain value for that type of burst is adjusted downward by one step (2 dB) and stored in the appropriate register.
9. If the minimum power register value is less than the minimum power threshold, the PGA gain value for that type of burst is adjusted upward by one step (2 dB) and stored in the appropriate register.
10. At the start of the next frame, the new gain values become valid, i.e. the pending gain values are transferred to the current gain registers, and the out-of-range indicators are cleared Thus, the PGA controller 62 of the present invention also allows for compensation of the predetermined attenuation values associated with the different data modes. It is noted that each of the gain computation circuits also receive an input signal 79 indicating the start and stop points of the frames.

As described above, the system and method of providing automatic gain control in accordance with the present invention provides important advantages over prior art devices. Most importantly, the AGC system and method of the present invention allows for the compensation/processing of a wide dynamic range regarding the input signal without requiring the use of a fast, high-order bit A/D converter in the demodulator. As noted, the use of such an A/D converter (assuming it is available) would render the overall system prohibitively expensive due to the cost of such an A/D converter. In contrast, as the present invention allows for the compensation of a large dynamic range utilizing a low-cost, readily available converter, the present invention results in a commercially viable system.

Of course, it should be understood that a wide range of other changes and modifications can be made to the preferred embodiment described above. It is therefore intended that the foregoing detailed description be regarded as illustrative rather than limiting and that it be understood that it is the following claims including all equivalents, which are intended to define the scope of the invention.

What is claimed is:

1. An apparatus for providing automatic gain control for use in a satellite terminal of a satellite communication system, said satellite communication system capable of transmitting data in a plurality of different broadcast modes, said apparatus comprising:
   a demodulator circuit having an analog to digital converter;
   a first variable attenuator having an attenuation value set on the basis of a measured power level of a predetermined data signal; and
   a second variable attenuator having an attenuation value set on the basis of the broadcast mode being transmitted by said satellite communication system each of said broadcast modes having a corresponding predetermined attenuation value associated therewith which is utilized as the attenuation value of said second variable attenuator when said satellite terminal receives said data.

2. The apparatus of claim 1, wherein said first variable attenuator and said second variable attenuator are operative for maintaining the input power level to said analog to digital convener within a predetermined range.

3. The apparatus of claim 1, wherein said first variable attenuator comprises a variable gain amplifier, said variable gain amplifier having an input control signal representing the measured power level of said predetermined data signal, said input control signal being updated such that said variable gain amplifier compensates for variations in the power level of said predetermined data signal over time.

4. The apparatus of claim 3, wherein said input control signal comprises a modulated signal which is continuously fed to said variable gain amplifier, said modulated signal being generated by a circuit operative for tracking changes in the power level of said predetermined data signal during operation of said satellite terminal.

5. The apparatus of claim 1, wherein said second variable attenuator comprises a programmable gain amplifier, said programmable gain amplifier being programmed to the predetermined attenuation value corresponding to the broadcast mode utilized to transmit the data being processed by said demodulator.

6. The apparatus of claim 5, wherein said broadcast mode being utilized to transmit the data to be received by the demodulator is known a priori such that said programmable gain amplifier can be programmed to the predetermined attenuation value corresponding to the given data broadcast mode prior to said demodulator processing such data.

7. A method for providing automatic gain control for use in a satellite terminal of a satellite communication system, said satellite communication system capable of transmitting data in a plurality of different broadcast modes, said method comprising the steps of:

measuring a power level of a predetermined data signal received by said satellite terminal, adjusting an attenuation value of a first variable attenuator on the basis of said measured power level of said predetermined data signal, adjusting an attenuation value of a second variable attenuator on the basis of the broadcast mode being transmitted by said satellite communication system, each of said data broadcast modes having a corresponding predetermined attenuation value associated therewith which is utilized as the attenuation value of said second variable attenuator when said satellite terminal receives said data, wherein said first variable attenuator and said second variable attenuator are operative for maintaining the input power level to an analog to digital converter contained in a demodulator of said satellite terminal within a predetermined range.

8. The method of claim 7, wherein said first variable attenuator comprises a variable gain amplifier, said variable gain amplifier having an input control signal representing the measured power level of said predetermined data signal, said input control signal being updated such that said variable gain amplifier compensates for variations in the power level of said predetermined data signal over time.

9. The method of claim 8, wherein said input control signal comprises a modulated signal which is continuously fed to said variable gain amplifier, said modulated signal being generated by a circuit operative for tracking changes in the power level of said predetermined data signal during operation of said satellite terminal.

10. The method of claim 7, wherein said second variable attenuator comprises a programmable gain amplifier, said programmable gain amplifier being programmed to the predetermined attenuation value corresponding to the broadcast mode utilized to transmit the data being processed by said demodulator.

11. The method of claim 10, wherein said broadcast mode being utilized to transmit the data to be received by the demodulator is known a priori such that said programmable gain amplifier can be programmed to the predetermined attenuation value corresponding to the given broadcast mode prior to said demodulator processing such data.

12. An apparatus for providing automatic gain control for use in a satellite terminal of a satellite communication system, said satellite communication system capable of transmitting data in a plurality of different broadcast modes, said apparatus comprising:

means for measuring a power level of a predetermined data signal received by said satellite terminal, means for adjusting an attenuation value of a first variable attenuator on the basis of said measured power level of said predetermined data signal, means for adjusting an attenuation value of a second variable attenuator on the basis of the broadcast mode being transmitted by said satellite communication system, each of said broadcast modes having a corresponding predetermined attenuation value associated therewith which is utilized as the attenuation value of said second variable attenuator when said satellite terminal receives said data, wherein said first variable attenuator and said second variable attenuator are operative for maintaining the input power level to an analog to digital converter contained in a demodulator of said satellite terminal within a predetermined range.

13. The apparatus of claim 12, wherein said first variable attenuator comprises a variable gain amplifier, said variable gain amplifier having an input control signal representing the measured power level of said predetermined data signal, said input control signal being updated such that said variable gain amplifier compensates for variations in the power level of said predetermined data signal over time.

14. The apparatus of claim 13, wherein said input control signal comprises a modulated signal which is continuously fed to said variable gain amplifier, said modulated signal being generated by a circuit operative for tracking changes in the power level of said predetermined data signal during operation of said satellite terminal.

15. The apparatus of claim 12, wherein said second variable attenuator comprises a programmable gain amplifier, said programmable gain amplifier being programmed to the predetermined attenuation value corresponding to the broadcast mode utilized to transmit the data being processed by said demodulator.

16. The apparatus of claim 15, wherein said broadcast mode being utilized to transmit the data to be received by the demodulator is known a priori such that said programmable gain amplifier can be programmed to the predetermined attenuation value corresponding to the given broadcast mode prior to said demodulator processing such data.

* * * * *